United States Patent [19]

Danenberg et al.

[11] Patent Number: 4,941,069
[45] Date of Patent: Jul. 10, 1990

[54] RECTIFIER SPACER/MOUNTING ASSEMBLY

[75] Inventors: Bernard Danenberg, Skokie; Luigi Flori, Mundelein, both of Ill.

[73] Assignee: Zenith Electronics Corporation, Glenview, Ill.

[21] Appl. No.: 216,121

[22] Filed: Jul. 7, 1988

[51] Int. Cl.⁵ .............................................. H05K 7/20
[52] U.S. Cl. ................... 361/419; 174/138 G;
    439/374; 439/526; 411/177; 361/383; 361/405
[58] Field of Search ............... 165/80.3, 185; 357/81;
    361/383, 384, 386–388, 400, 403, 405, 417–420;
    174/16.3, 138 G; 439/374, 70, 72, 526, 813;
    411/177, 182, 183, 105, 112, 113, 907, 908

[56] References Cited

U.S. PATENT DOCUMENTS

| | | |
|---|---|---|
| 2,201,611 | 5/1940 | Del Camp . |
| 2,395,326 | 2/1946 | Handley et al. . |
| 2,990,533 | 6/1961 | Hughes et al. . |
| 3,008,112 | 11/1961 | Swengel . |
| 3,133,773 | 5/1964 | Ecker . |
| 3,184,536 | 5/1965 | Vincent ................... 174/138 G |
| 3,250,851 | 5/1966 | Boening ................... 174/138 G |
| 3,292,135 | 12/1966 | Robinson ................. 174/138 G |
| 3,366,914 | 1/1968 | McManus et al. . |
| 3,384,853 | 5/1968 | Rademacher . |
| 3,388,366 | 6/1968 | Mitchell . |
| 3,391,375 | 7/1968 | Richards . |
| 3,601,699 | 8/1971 | Norton, Jr. ............... 174/138 G |
| 3,659,134 | 4/1972 | Wanner . |
| 3,873,173 | 3/1975 | Anhalt ....................... 361/403 |
| 3,877,064 | 4/1975 | Scheingold ................ 361/403 |
| 4,054,901 | 10/1977 | Edwards et al. . |
| 4,344,106 | 8/1982 | West et al. . |
| 4,388,967 | 6/1983 | Breese . |
| 4,609,040 | 9/1986 | Moore . |
| 4,611,972 | 9/1986 | Andrae ..................... 411/908 |
| 4,667,270 | 5/1987 | Yagi ........................... 361/417 |
| 4,790,701 | 12/1988 | Baubles .................... 411/177 |

*Primary Examiner*—Gerald P. Tolin

[57] ABSTRACT

A spacer/mounting assembly preferably comprised of molded plastic is adapted for mounting a four lead power dissipating electronic component, e.g., a rectifier, on a printed circuit (PC) board. The spacer/mounting assembly includes a center aperture and four peripheral apertures. Each of the four peripheral apertures includes a funnel-shaped upper end to facilitate insertion of a respective component lead therethrough to allow the lower end of each of the leads to be attached to and coupled in circuit on the PC board. The center aperture is keyed to receive and engage either a nut or screw head and includes a pair of resilient looking tabs adapted to engage and maintain the nut (or screw) in position within the spacer/mounting assembly. A power dissipating electronic component as well as an optional heat sink may then be easily mounted on an upper portion of the assembly in a secure manner. The spacer/mounting assembly insulates the PC board from heat produced by the electronic component and limits heat build-up by ensuring at least a minimum lead length for heat dissipation, while affording stable and secure component mounting.

14 Claims, 1 Drawing Sheet

U.S. Patent  Jul. 10, 1990  4,941,069
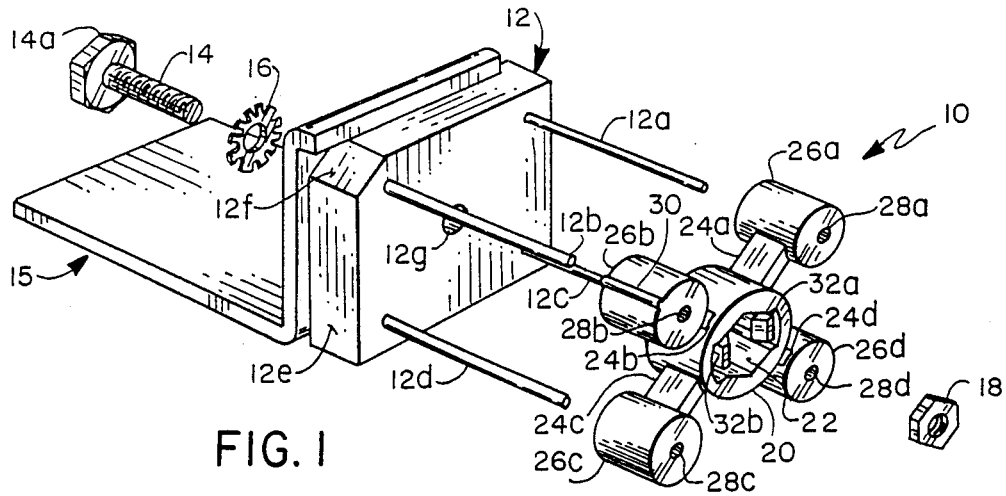
FIG. 1
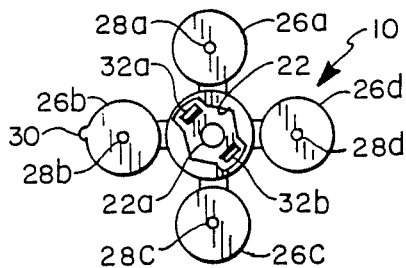
FIG. 2
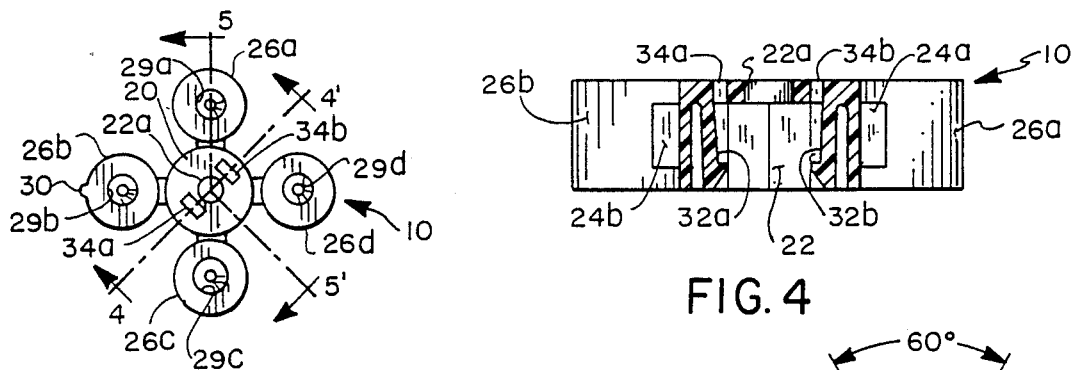
FIG. 4
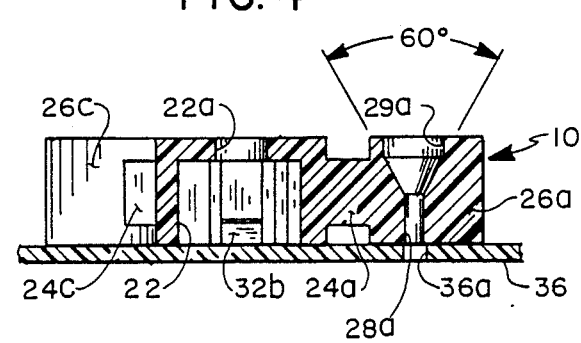
FIG. 5
FIG. 3
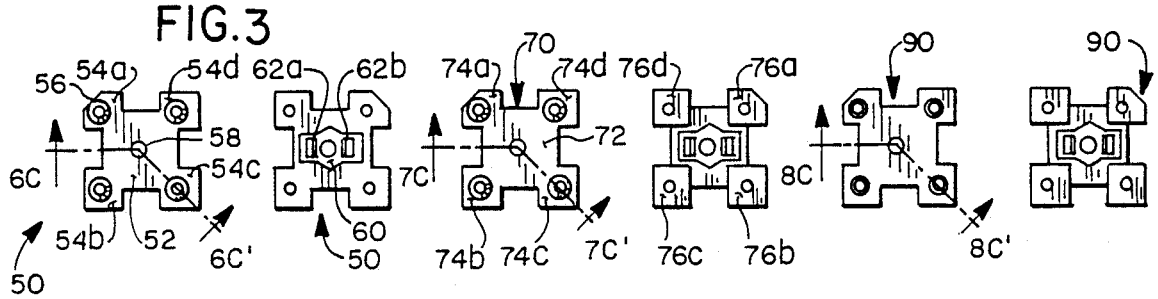
FIG. 6A  FIG. 6B  FIG. 7A  FIG. 7B  FIG. 8A  FIG. 8B
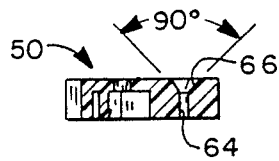
FIG. 6C
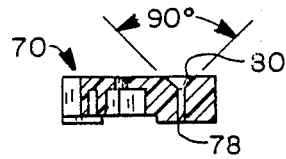
FIG. 7C
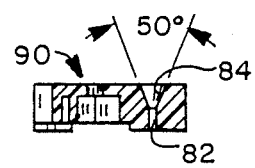
FIG. 8C

RECTIFIER SPACER/MOUNTING ASSEMBLY

BACKGROUND OF THE INVENTION

This invention relates generally to electronic components as employed on printed circuit (PC) boards and is particularly directed to the mounting of a four lead power dissipating component on a PC board.

Electronic circuits are generally comprised of a plurality of components mounted to and coupled in circuit on a PC board which has a plurality of conductors on its surface, or surfaces, connecting the various components in circuit. The PC board provides support for the electronic components as well as electrical isolation between the components. The PC board typically includes a plurality of apertures through which the conductive leads of the various components are inserted and maintained in position for mounting the component to the PC board as well as coupling the component in circuit by solder connections. Assembly of the PC board requires precise positioning of each of the components to ensure that its conductive leads are inserted in the proper apertures within the PC board. Even with the increasing use of robotics for automatic component placement on the PC board, inaccurate component positioning continues to be a manufacturing problem resulting in PC board rejection and increased manufacturing costs.

Some electronic components operate at high temperatures and this presents another potential problem. These components are typically termed "power dissipating" components, with the multi-diode rectifier circuit perhaps the most common examples of such a component. In order to reduce potential problems arising from these high temperatures it is frequently desirable to mount a heat dissipating device, i.e., a heat sink, directly to the component. This provides efficient heat dissipation and affords cooler circuit operation. Because of the large amount of heat generated by the typical power rectifier, it is further desirable to physically isolate the rectifier circuit from the PC board in order to minimize heat transfer to the PC board. However, such arrangements in the past have been overly complicated and generally not amenable to high speed, mass production procedures.

The present invention addresses all of the aforementioned limitations of the prior art by providing a spacer/mounting assembly adapted for the secure mounting and electrical coupling of a four lead power dissipating electronic component on a PC board. The spacer/mounting assembly not only facilitates positioning and placement of an electronic component such as a rectifier on a PC board, but also allows for enhanced heat dissipation and provides thermal isolation between the component and PC board.

OBJECTS OF THE INVENTION

Accordingly, it is an object of the present invention to facilitate the secure and stable mounting of an electronic component on a PC board.

It is another object of the present invention to provide increased heat dissipation for a power generating electronic component.

Yet another object of the present invention is to provide an integrated electronic component, heat sink, and mounting base assembly which is easily assembled and positioned on and mounted to a PC board.

A further object of the present invention is to provide a coupling and mounting arrangement for a metal heat sink and the molded plastic body of a rectifier which affords stable PC board mounting and improved PC board thermal isolation from the high operating temperatures of the rectifier circuit.

A still further object of the present invention is to provide a more reliable means for ensuring proper positioning on a PC board of an electronic component having four conductive leads.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

FIG. 1 is an exploded perspective view of a spacer/mounting assembly for mounting the combination of a rectifier and heat sink on a PC board;

FIG. 2 is a top planar view of the rectifier spacer/mounting assembly of FIG. 1;

FIG. 3 is a bottom plan view of the rectifier spacer/mounting assembly of FIG. 2;

FIG. 4 is a sectional view of the rectifier spacer/mounting assembly of FIG. 2 taken along sight line 4—4' therein;

FIG. 5 is a sectional view of the rectifier spacer/mounting assembly of FIG. 2 taken along sight line 5—5' therein;

FIGS. 6A and 6B are top planar and bottom planar views, respectively, of another embodiment of a rectifier spacer/mounting assembly in accordance with the present invention;

FIG. 6C is a sectional view of the rectifier spacer/mounting assembly of FIG. 6A taken along sight line 6C—6C' therein;

FIGS. 7A and 7B are top and bottom planar views, respectively, of yet another embodiment of a rectifier spacer/mounting assembly in accordance with the present invention;

FIG. 7C is a sectional view of the rectifier spacer/mounting assembly of FIG. 7A taken along sight line 7C—7C' therein;

FIGS. 8A and 8B are top and bottom planar views, respectively, of still another embodiment of a rectifier spacer/mounting assembly in accordance with the present invention; and FIG. 8C is a sectional view of the rectifier spacer/mounting assembly of FIG. 8A taken along sight line 8C—8C' therein.

DETAILED DESCRIPTION OF THE PREFERRED EMBODIMENT

Referring to FIG. 1, there is shown an exploded perspective view of a spacer/mounting assembly 10 for use in mounting a four lead rectifier circuit 12 in combination with a heat sink 15 to a PC board (not shown). Top and bottom planar views of the spacer/mounting assembly 10 illustrated in FIG. 1 are respectively shown in FIGS. 2 and 3.

The rectifier circuit 12 includes a plastic housing 12e within which the various components of the rectifier circuit, i.e., diodes, resistors, etc., are encased. The rectifier housing 12e includes an aperture 12g extending therethrough, as well as four conductive leads 12a, 12b, 12c and 12d extending from one surface of the housing. The conductive leads 12a-12d are used to physically attach the rectifier 12 to a PC board as well as to connect the rectifier in circuit with other circuit components and conductors also positioned on the PC board. The four conductive leads 12a-12d extend from the lower surface of the rectifier housing 12e as the rectifier 12 is generally mounted to a PC board. A lateral surface of the rectifier housing 12e is provided with a keyed, or notched, corner 12f to facilitate proper positioning and orientation of the rectifier 12 on the PC board.

A generally L-shaped heat sink 15 comprised of a metal having high thermal conductivity is shown positioned in contact with the rectifier 12. The intimate contact between the rectifier housing 12e and the heat sink 15 facilitates heat removal from the rectifier 12 and its dissipation by convection and radiation. The heat sink 15 also includes an aperture (not shown in FIG. 1 for simplicity), which is adapted to receive a threaded coupling pin 14, such as a conventional bolt or screw, for securely coupling the heat sink and rectifier 12. In coupling the heat sink 15 to the rectifier 12, the threaded portion of the coupling pin 14 is inserted through the apertures in the heat sink and rectifier housing 12e, with a lock washer 16 positioned about the coupling pin and in intimate contact with the heat sink and a head portion 14a of the coupling pin.

The spacer/mounting assembly 10 is preferably comprised of a molded plastic and includes a central body 20 and a plurality of peripheral bodies, or pods, 26a, 26b, 26c and 26d disposed uniformly thereabout. The central body 20 as well as each of the peripheral pods 26a-26d are generally cylindrical in shape, with their longitudinal axes aligned generally parallel. Each of the peripheral pods 26a-26d, is securely attached to an outer, lateral periphery of the central body 20 by coupling members 24a, 24b, 24c and 24d, respectively. The lateral surface of one of the peripheral pods 26b is provided with a keying rib 30 on an outer portion thereof to facilitate proper positioning of the spacer/mounting assembly 10 as well as the rectifier 12 attached thereto on a PC board. The keyed corner 12f of the rectifier housing 12e and the keying rib 30 on the spacer/mounting assembly 10 thus permit a worker assembler or a machine assembler to join the rectifier with the spacer/mounting assembly in the proper orientation and facilitate positioning of this combination for proper mounting on a PC board. Each of the peripheral pods 26a-26d includes a respective elongated, linear aperture 28a-28d extending therethrough. Each of the apertures 28a-28d is adapted to receive a respective conductive lead extending from the rectifier 12 to facilitate its secure mounting on a PC board.

Referring to the aforementioned figures as well as to FIGS. 4 and 5, which are respective sectional views taken along sight lines 4—4' and 5—5' in FIG. 2, it can be seen that the upper ends of each of the peripheral pod apertures 28a-28d are provided with a respective funnel-shaped portion 29a-29d. The enlarged upper end portions 29a-29d of each of the peripheral pod apertures 28a-28d facilitate insertion of a respective conductive lead of the rectifier into and through each of the peripheral pods.

The central body 20 also includes an aperture, or slot, 22 extending therethrough. The upper end portion 22a of the aperture 22 is smaller than its lower portion. Positioned in an upper surface of the central body 20 and disposed adjacent to facing portions of the upper end 22a of the center aperture therein are first and second relief holes 34a, 34b. Extending downward from a lower, inner surface of the central body 20 and respectively disposed adjacent to the first and second relief holes 34a, 34b are first and second resilient locking tabs 32a, 32b. Each of the locking tabs 32a, 32b is adapted for bending inward and outward relative to the central axis of the central body 20 which extends through the aperture 22 therein. The relief holes 34a, 34b facilitate flexing displacement of the first and second resilient locking tabs 32a, 32b. Each of the first and second locking tabs 32a, 32b includes an inwardly directed shoulder which is adapted to securely engage a nut 18 inserted therebetween. Positioning of the nut 18 in the lower end portion of the central body's aperture 22 and upward displacement of the nut causes the outward flexing displacement of the first and second locking tabs 32a, 32b. Continued upward displacement of the nut 18 moves it beyond the facing notches in the first and second locking tabs 32a, 32b, allowing the locking tabs to be displaced inwardly in assuming their original, relaxed configuration. With the nut 18 positioned above the facing projections on the first and second locking tabs 32a, 32b, the locking tabs securely maintain the nut in position within the aperture 22 of the central body 20.

With each of the conductive leads 12a-12d of the rectifier 12 inserted through a respective aperture in each of the peripheral pods 26a-26, and the central body 20 positioned in intimate contact with the surface of the rectifier housing 12e from which the conductive leads extend, the combination of the heat sink 15, the rectifier and spacer/mounting assembly 10 may be securely coupled together by inserting the threaded coupling pin 14 through the apertures in the heat sink and rectifier as well as through the aperture 22 in the spacer/mounting assembly's central body 20. Insertion of the threaded end of the coupling pin 14 in the nut 18, which is maintained securely in position in the central body 20, followed by rotational displacement of the coupling pin results in secure coupling between the coupling pin and nut as well as secure coupling between the heat sink 15, rectifier 12 and spacer/mounting assembly 10. The hexagonal cross sectional shape of the aperture 22 within the central body 20 conforms with the outer periphery of the hexagonal nut 18 to prevent its rotation and facilitate insertion and coupling of the coupling pin 14 to the nut.

While the combination of the spacer/mounting assembly 10, the rectifier 12, and the heat sink 15 is shown coupled together by inserting the threaded coupling pin 14 through the heat sink first, or in a downward direction, it may also be inserted upward through the spacer/mounting assembly. In the latter approach, the coupling pin's head 14a is positioned within the aperture 22 of the central body 20 and is maintained in position therein by the pair of locking tabs 32a, 32b. By matching the cross sectional size and shape of the coupling pin's head 14a with the central body's aperture 22 (which are shown as hexagonal in the figures), the coupling pin will be maintained in position within the central body and will not be free to rotate therein. In this manner, the combination of the spacer/mounting assembly 10, the rectifier 12, and the heat sink 15 may be securely coupled together by positioning the mounting nut 18 on the upper end of the coupling pin 14 and rotating the nut until positioned in intimate contact with an upper surface of the heat sink.

Referring to FIGS. 6A and 6B, there are respectively shown top and bottom planar views of another embodiment of a spacer/mounting assembly 50 in accordance with the principles of the present invention. As in the case of the embodiment described above, the spacer/mounting assembly 50 shown in FIGS. 6A and 6B also includes a unitary body 52 preferably comprised of a molded plastic. The body 52 includes corner portions 54a–54d, each containing a respective aperture for receiving one of the four leads of a rectifier circuit. The body 52 further includes a center aperture 60 within which are disposed a pair of locking tabs 62a, 62b as previously described with respect to the embodiment shown in FIGS. 1–5.

Referring to FIG. 6C, there is shown a sectional view of the spacer/mounting assembly 50 illustrated in FIG. 6A taken along sight line 6C–6C' therein. A sectional view of one of the peripheral apertures 64 through which a conductive lead of the rectifier circuit is inserted is shown in FIG. 6C. The upper end of the peripheral aperture 64 is provided with a funnel-shaped, enlarged portion 66c having a 90° opening to facilitate insertion of a rectifier lead therein.

Referring to FIGS. 7A and 7B, there are respectively shown top and bottom planar views of yet another embodiment of a spacer/mounting assembly 70 in accordance with the present invention. The spacer/mounting assembly 70 in these figures also includes a unitary body 72 having four corner portions 74a–74d. Extending downward from each of the aforementioned corner portions 74a–74d is a respective mounting foot 76a–76d. Each of the mounting feet 76a–76d extends downward from the body 72 of the spacer/mounting assembly 70 and is adapted for secure engagement with the surface of a PC board. In this manner, the body 72 of the spacer/mounting assembly 70 may be maintained in spaced relation from the PC board to which it is securely and stably mounted. In addition, this embodiment of the present invention as well as all other embodiments discussed herein maintains the combination of a threaded screw and nut used to securely couple the spacer/mounting assembly, rectifier and heat sink in an upraised position from the PC board and all conductors thereon. By thus maintaining the coupling screw/nut combination displaced from the PC board, the threaded screw and nut are prevented from contacting the circuit board in rendering the spacer/mounting assembly in an unstable condition or contacting a conductor on the PC board and damaging or rendering inoperative circuitry positioned on the PC board. As shown in FIG. 7C, which is a sectional view of the spacer/mounting assembly 70 illustrated in FIG. 7A, taken along sight line 7C–7C' therein, each of the conductive lead receiving apertures 78 includes a funnel-shaped upper end portion 80 having a 90° opening.

Referring to FIGS. 8A, 8B and 8C, there is shown a spacer/mounting assembly 90 similar to that illustrated in FIGS. 7A–7C. The embodiment of FIGS. 8A–8C differs from that of FIGS. 7A–7C in that, as shown in FIG. 8C, each of the conductive lead receiving apertures 82 has a funnel-shaped upper end portion 84 with a 50° rather than a 90° opening.

There has thus been shown a spacer/mounting assembly for mounting a power dissipating, four lead electronic component on a PC board. The spacer/mounting assembly is particularly adapted for mounting the combination of a rectifier and heat sink on a PC board in a manner which provides thermal isolation between the rectifier and PC board, ensures at least a minimum component lead length for improved heat dissipation, and facilitates attachment of the spacer/mounting assembly, rectifier and heat sink to form a securely coupled combination in which the coupling means is maintained in a spaced manner from the PC board.

While particular embodiments of the present invention have been shown and described, it will be obvious to those skilled in the art that changes and modifications may be made without departing from the invention in its broader aspects Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A spacer/mounting assembly mounting to a PC board a rectifier having a housing and four conductive leads extending therefrom, said spacer/mounting assembly comprising:

a unitary body positioned on the PC board and including a first center aperture and a plurality of second outer apertures extending through said body, wherein said first center aperture has a first narrow portion and a second enlarged portion and each of said second apertures receives a respective lead of the rectifier;

first and second threaded attaching means in mutual engagement and securely mounting the rectifier to a first surface of said unitary body, wherein at least one of said first and second attaching means is disposed within said first center aperture of said body and wherein the first narrow portion of said first center aperture is disposed adjacent to the first surface of said unitary body; and retaining means disposed within the second enlarged portion of said first aperture in said body engaging either said first or said second attaching means which is disposed within the body's first center aperture, said retaining means including a pair of locking tabs for preventing the rotation and removal of said attaching means from said body.

2. The spacer/mounting assembly of claim 1 wherein said unitary body is comprised of molded plastic.

3. The spacer/mounting assembly of claim 1 wherein each of said second outer apertures is an elongated, linear slot extending through said unitary body.

4. The spacer/mounting assembly of claim 2 wherein each of said elongated, linear slots includes an enlarged end portion adjacent to the first surface of said unitary body.

5. The spacer/mounting assembly of claim 4 wherein the enlarged end portion of each of said slots is funnel-shaped.

6. The spacer/mounting assembly of claim 3 wherein each of said elongated linear slots is adjacent to a lateral periphery of said unitary body.

7. The spacer/mounting assembly of claim 1 wherein said locking tabs are disposed in facing relation within the first aperture of said unitary body.

8. The spacer/mounting assembly of claim 7 wherein each locking tab is a resilient member extending from said unit body into its first aperture.

9. The spacer/mounting assembly of claim 1 wherein said unitary body includes keying means for facilitating proper positioning of said spacer/mounting assembly on the PC board.

10. The spacer/mounting assembly of claim 9 wherein said keying means comprises a rib disposed on a lateral surface of said unitary body.

11. The spacer/mounting assembly of claim 9 wherein said keying means comprises a notch in a lateral surface of said unitary body.

12. The spacer/mounting assembly of claim 1 further comprising a plurality of mounting feet disposed on a second surface of said unitary body in facing relation to said first surface.

13. The spacer/mounting assembly of claim 12 wherein each of said mounting feet is disposed adjacent to a lateral periphery of said unitary body and to a respective one of said second apertures.

14. The spacer/mounting assembly of claim 1 wherein said unitary body includes a center portion and a plurality of peripheral portions each coupled to said center portion and extending therefrom and including a respective one of said second apertures.

* * * * *